(12) United States Patent
Shank et al.

(10) Patent No.: US 6,782,759 B2
(45) Date of Patent: Aug. 31, 2004

(54) ANTI-ENTRAPMENT SYSTEM

(75) Inventors: David W. Shank, Hersey, MI (US);
Randall L. Perrin, Cadillac, MI (US);
John M. Washeleski, Cadillac, MI (US)

(73) Assignee: Nartron Corporation, Reed City, MI (US)

(*) Notice: Subject to any disclaimer, the term of this patent is extended or adjusted under 35 U.S.C. 154(b) by 118 days.

(21) Appl. No.: 10/262,446

(22) Filed: Sep. 30, 2002

(65) Prior Publication Data

US 2003/0056600 A1 Mar. 27, 2003

Related U.S. Application Data

(63) Continuation-in-part of application No. 09/901,883, filed on Jul. 9, 2001, now Pat. No. 6,499,359.

(51) Int. Cl.$^7$ ................................................. G01L 1/00
(52) U.S. Cl. ........................ 73/780; 73/774; 361/277; 318/445; 318/255
(58) Field of Search ........................ 73/760, 774, 780; 361/277, 280; 318/445–478, 255–279

(56) References Cited

U.S. PATENT DOCUMENTS

| | | |
|---|---|---|
| 3,710,209 A | 1/1973 | Webb et al. |
| 3,875,481 A | 4/1975 | Miller et al. |
| 3,951,250 A | 4/1976 | Pointon et al. |
| 3,964,594 A | 6/1976 | Gabbrielli et al. |
| 3,965,399 A | 6/1976 | Walker, Jr. et al. |
| 4,132,487 A | 1/1979 | Fisher |
| 4,266,263 A | 5/1981 | Haberl et al. |
| 4,370,697 A | 1/1983 | Haberl et al. |
| 4,373,122 A | 2/1983 | Frame |
| 4,373,124 A | 2/1983 | Frame |
| 4,437,138 A | 3/1984 | Nicol |
| 4,521,685 A | 6/1985 | Rebman |
| 4,526,043 A | 7/1985 | Boie et al. |
| 4,584,625 A | 4/1986 | Kellogg |
| 4,731,548 A | 3/1988 | Ingraham |
| 4,758,735 A | 7/1988 | Ingraham |
| 4,831,279 A | 5/1989 | Ingraham |

(List continued on next page.)

FOREIGN PATENT DOCUMENTS

| | | |
|---|---|---|
| DE | 37 34 023 A | 4/1989 |
| DE | 40 04 353 A1 | 8/1991 |
| DE | 198 10 077 A1 | 9/1998 |
| DE | 197 32 027 A | 1/1999 |
| EP | 0 855 307 A2 | 7/1998 |
| EP | 1 154 110 A2 | 5/2001 |
| FR | 2 163 814 A | 7/1973 |
| JP | 08029271 A * | 2/1996 ............. G01L/1/18 |

*Primary Examiner*—Edward Lefkowitz
*Assistant Examiner*—Alandra Ellington
(74) *Attorney, Agent, or Firm*—Brooks Kushman P.C.

(57) ABSTRACT

An anti-entrapment system for preventing an object from being entrapped by a translating device includes a capacitance sensor positioned adjacent to the translating device. The sensor has first and second flexible conductors separated by a separation distance. The conductors have a capacitance dependent on the separation distance. The sensor has a compressible dielectric element interposed between the conductors. The capacitance of the conductors changes in response to the separation distance changing as a result of the dielectric element compressing in response to a first object touching the sensor. The capacitance of the conductors changes in response to a second conductive object coming into proximity with at least one conductors. A controller controls the translating device as a function of the capacitance of the conductors to prevent the translating device from entrapping either of the first object or the second conductive object.

55 Claims, 12 Drawing Sheets

U.S. PATENT DOCUMENTS

| | | |
|---|---|---|
| 4,843,891 A | 7/1989 | Brunner et al. |
| 4,976,337 A | 12/1990 | Trett |
| 5,036,275 A | 7/1991 | Munch et al. |
| 5,087,825 A | 2/1992 | Ingraham |
| 5,142,822 A | 9/1992 | Beckerman |
| 5,210,490 A | 5/1993 | Munch et al. |
| 5,216,364 A | 6/1993 | Ko et al. |
| 5,217,280 A | 6/1993 | Nykerk et al. |
| 5,334,876 A | 8/1994 | Washeleski et al. |
| 5,436,539 A * | 7/1995 | Wrenbeck et al. .......... 318/265 |
| 5,447,076 A | 9/1995 | Ziegler |
| 5,459,962 A | 10/1995 | Bonne et al. |
| 5,625,980 A * | 5/1997 | Teich et al. .................... 49/26 |
| 5,642,043 A | 6/1997 | Ko et al. |
| 5,775,332 A | 7/1998 | Goldman |
| 5,789,915 A | 8/1998 | Ingraham |
| 5,796,183 A | 8/1998 | Hourmand |
| 5,851,026 A | 12/1998 | Schoos et al. |
| 5,880,421 A * | 3/1999 | Tsuge et al. ............. 200/61.44 |
| 5,907,213 A | 5/1999 | Oshima et al. |
| 5,952,801 A | 9/1999 | Boisvert et al. |
| 6,006,386 A | 12/1999 | Mohaupt |
| 6,038,930 A | 3/2000 | Lehnen et al. |
| 6,064,165 A | 5/2000 | Boisvert et al. |
| 6,081,088 A * | 6/2000 | Ishihara et al. ............. 318/466 |
| 6,142,513 A | 11/2000 | Schoos et al. |
| 6,233,872 B1 | 5/2001 | Glagow et al. |
| 6,297,605 B1 | 10/2001 | Butler et al. |
| 6,377,009 B1 * | 4/2002 | Philipp ....................... 318/468 |
| 6,404,158 B1 | 6/2002 | Boisvert et al. |
| 6,483,054 B2 * | 11/2002 | Suzuki et al. ............ 200/61.44 |
| 2002/0043948 A1 | 4/2002 | Ogasawara |
| 2002/0078758 A1 * | 6/2002 | Suzuki et al. ................. 73/753 |

* cited by examiner

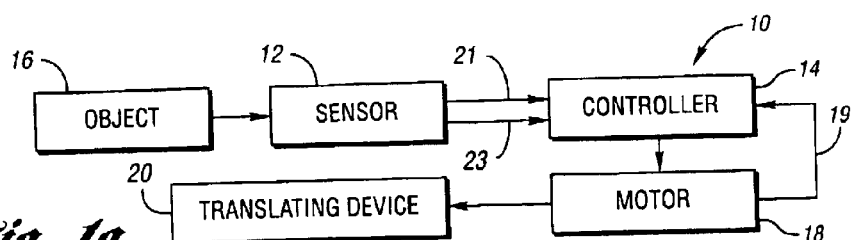
*Fig. 1a*
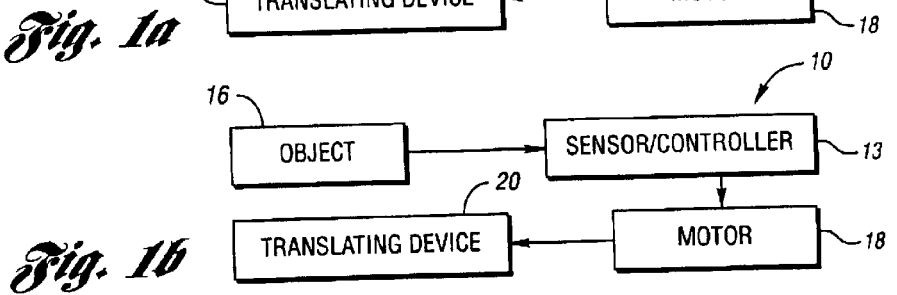
*Fig. 1b*
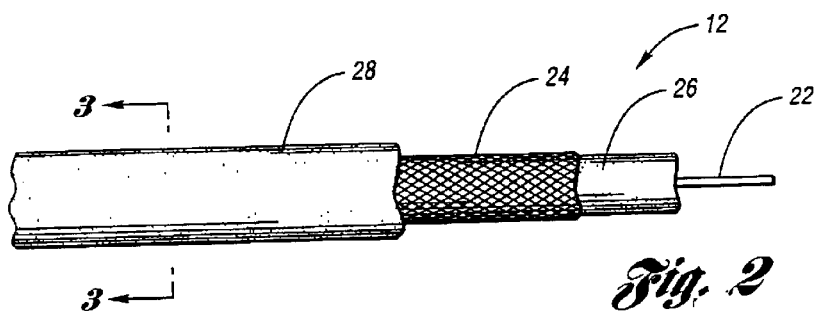
*Fig. 2*
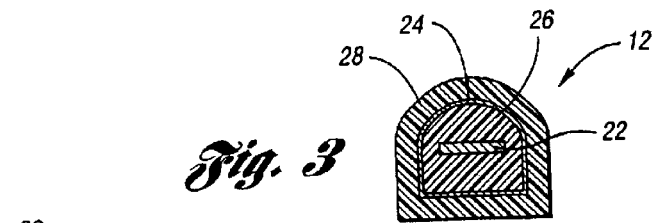
*Fig. 3*
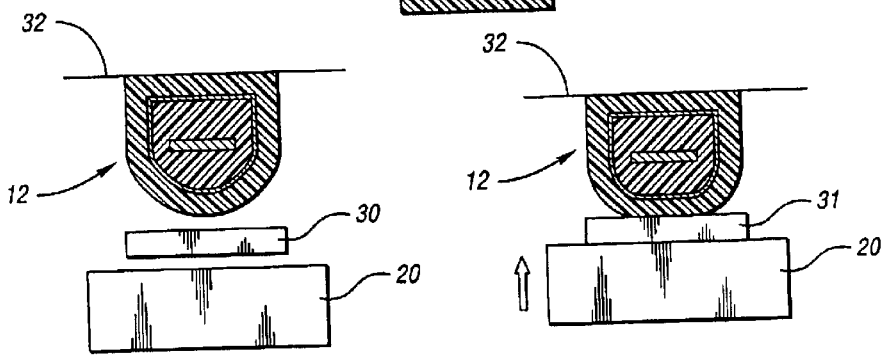
*Fig. 4a*  *Fig. 4b*

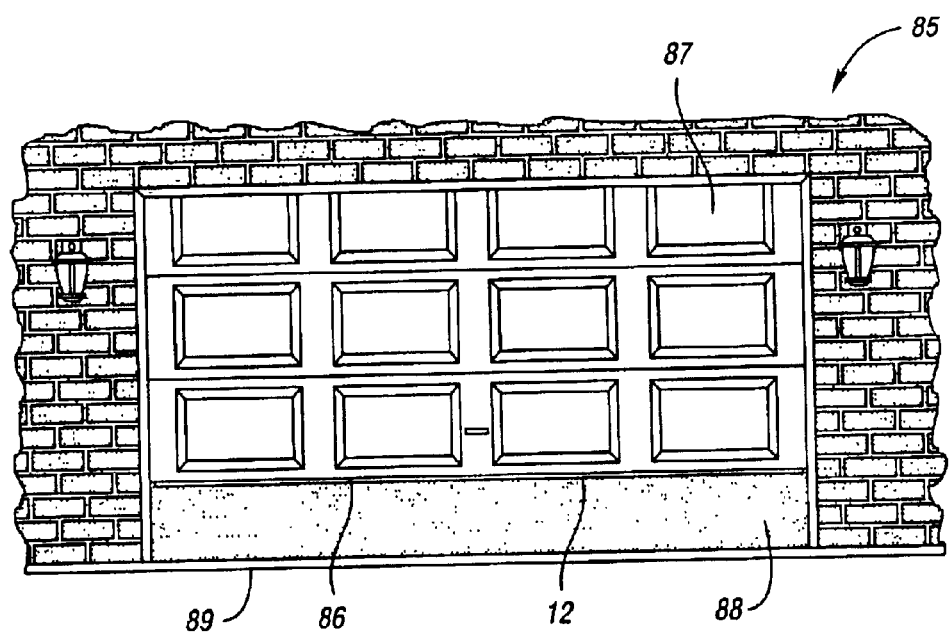
Fig. 14
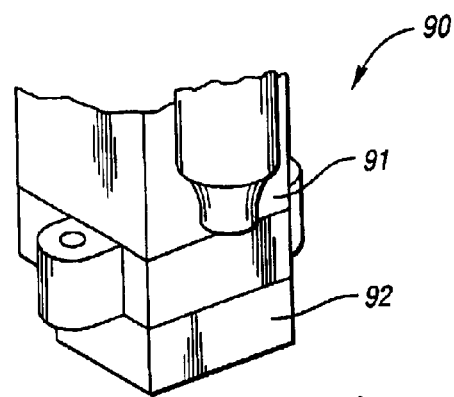
Fig. 15
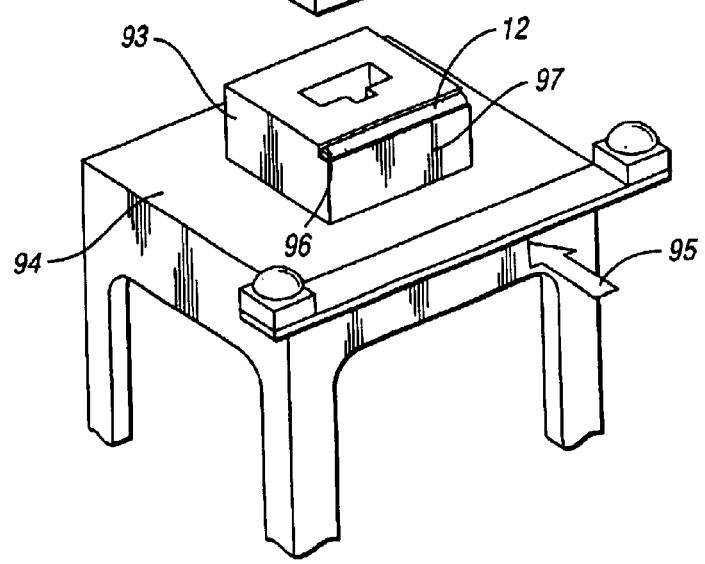

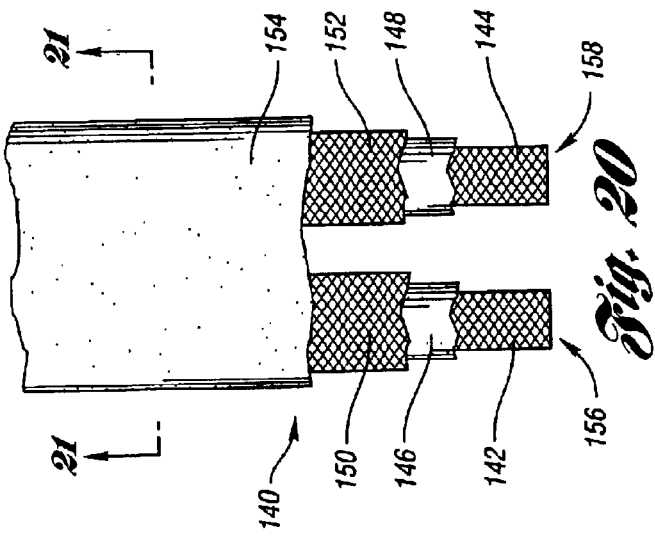
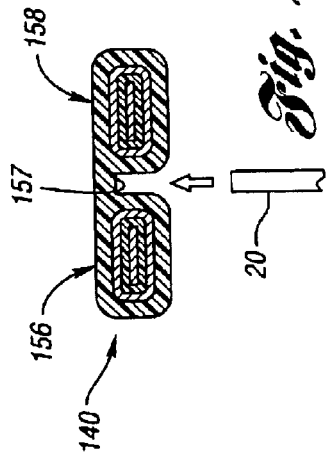
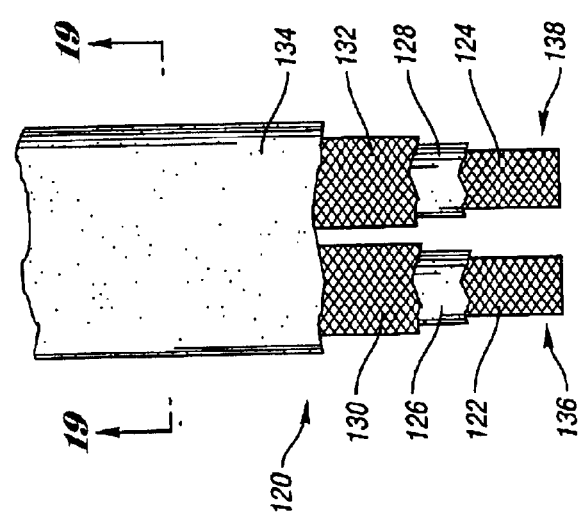
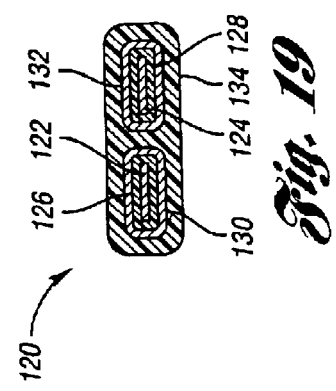
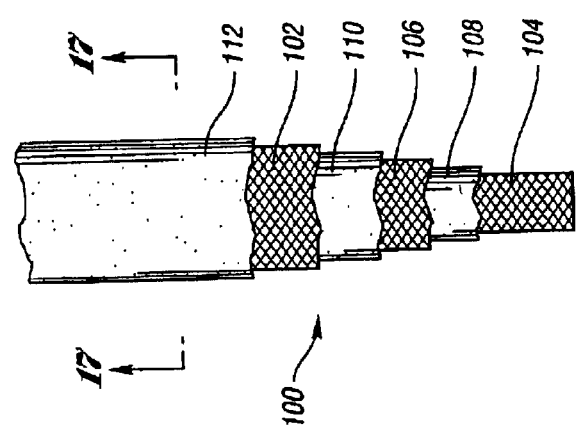
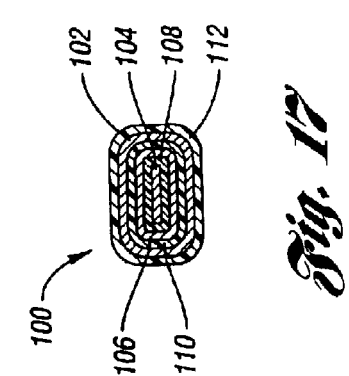

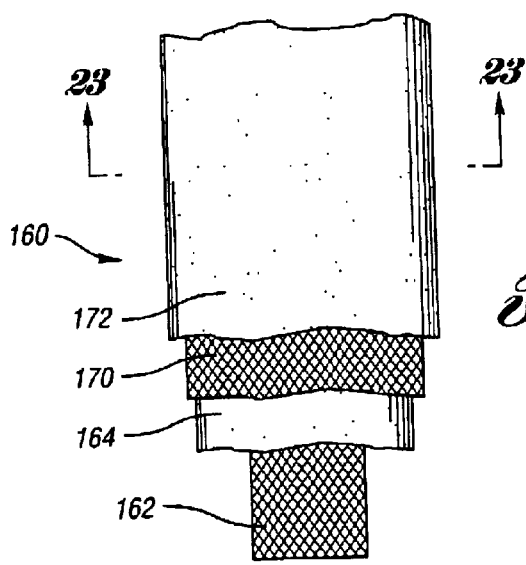
Fig. 22
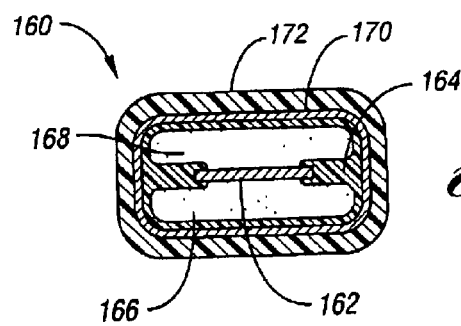
Fig. 23
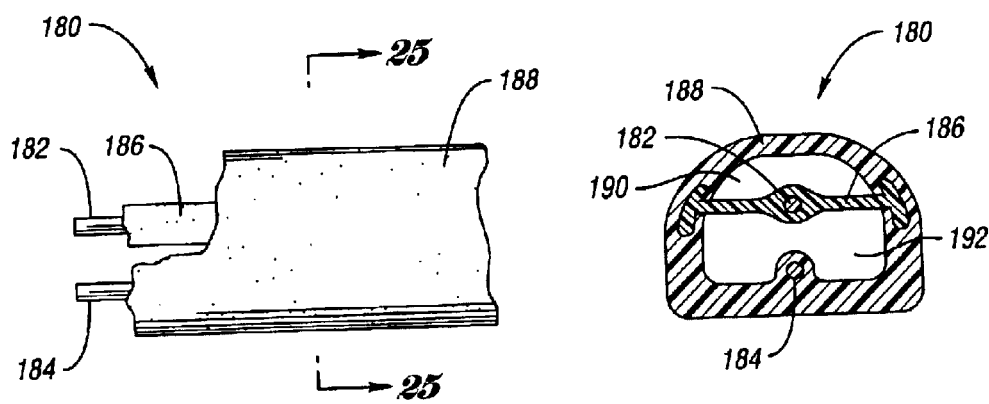
Fig. 24
Fig. 25

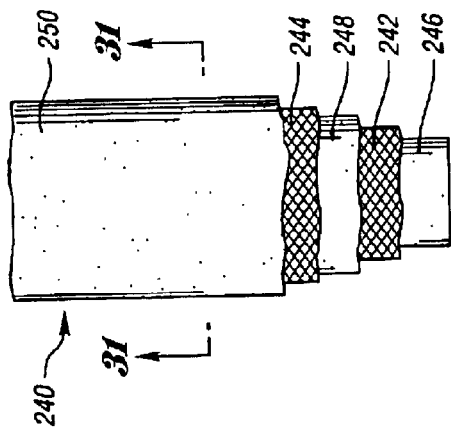
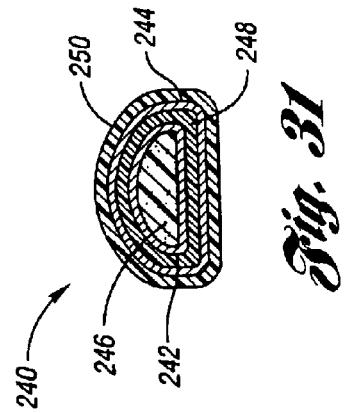
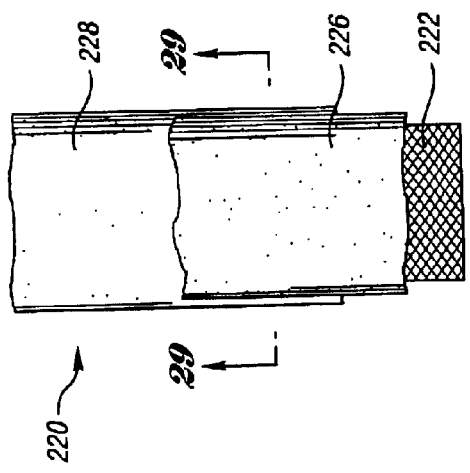
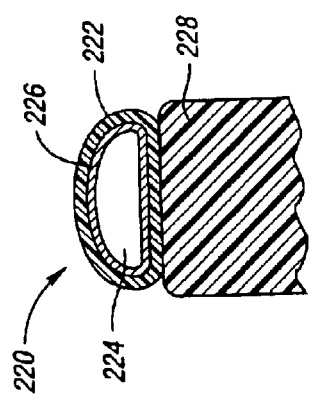
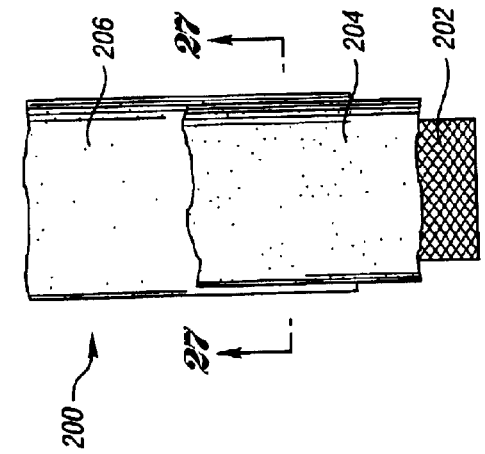
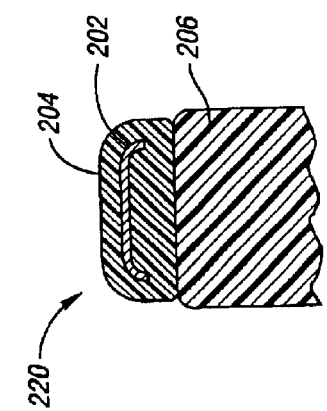

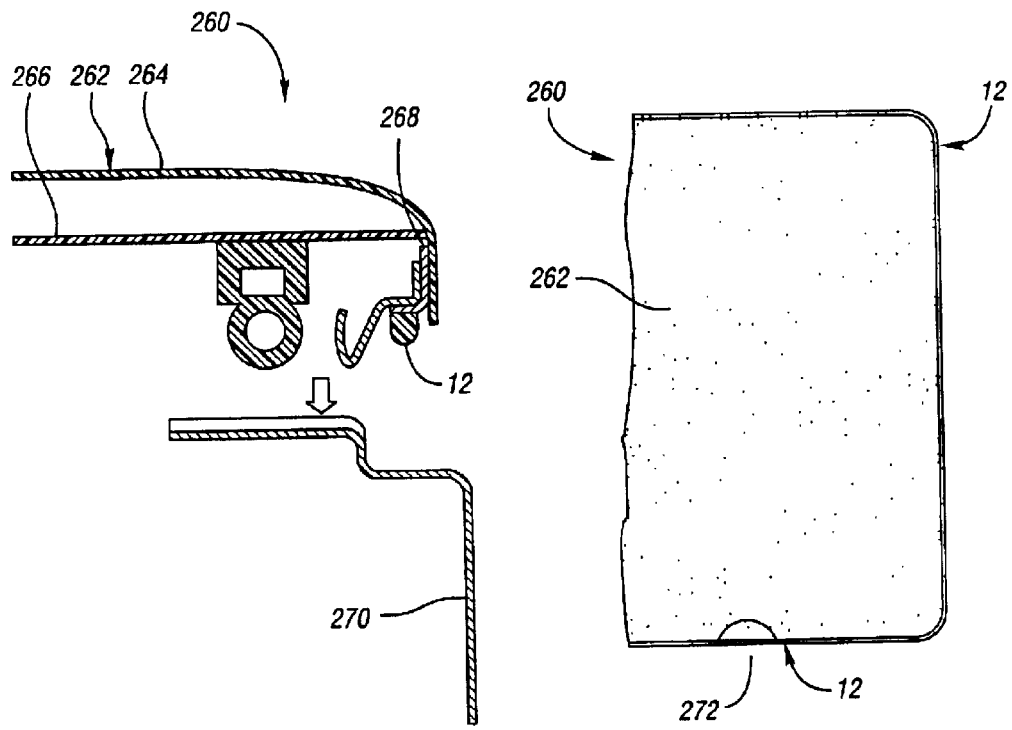
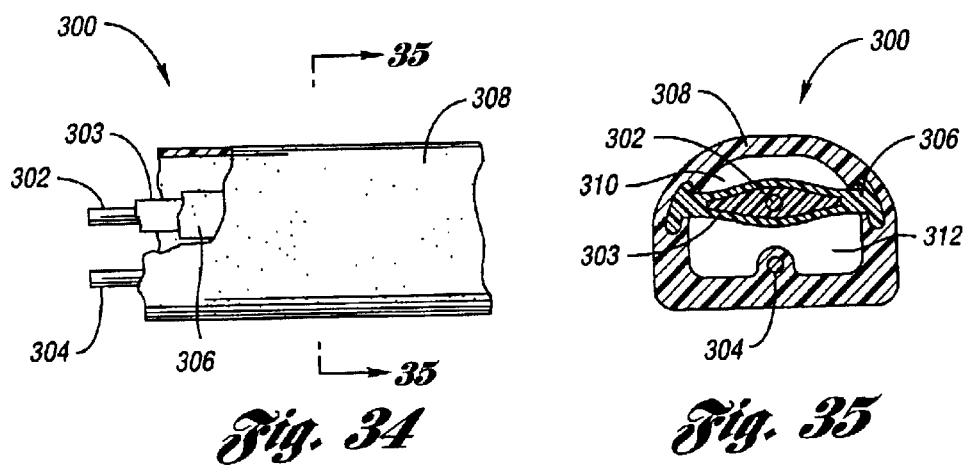

ANTI-ENTRAPMENT SYSTEM

CROSS-REFERENCE TO RELATED APPLICATIONS

This application is a continuation-in-part of U.S. application Ser. No. 09/901,883, filed on Jul. 9, 2001 now U.S. Pat. No. 6,499,359.

BACKGROUND OF THE INVENTION

1. Field of the Invention

The present invention relates to an anti-entrapment system provided with a capacitance sensor for preventing entrapment of an object.

2. Background Art

Anti-entrapment systems use various types of sensors to detect pinching of an object such as a human body part. For example, in automobiles, sensors are used for pinch sensing at electrically operated doors, windows, hatches, decks, hoods, lids, and the like.

A pinch sensor detects pinching an object by a translating device such as a window, door, sunroof, etc. In operation, the pinch sensor generates a pinch sensor signal in response to the object such as a person's finger being pinched by a translating device such as a window as the window is closing. In response to the pinch sensor signal, a controller controls the window to reverse direction and open in order to prevent further pinching of the person's finger. As the window is opening, the person may remove his finger from the window opening between the top edge of the window and the window liner.

Motor current sensors, infrared beam sensors, and continuous switch sensors have been used as pinch sensors in anti-entrapment systems. A problem with these types of pinch sensors is that they require a relatively large amount of pinching of the object to take place before they detect pinching of the object.

SUMMARY OF THE INVENTION

Accordingly, it is an object of the present invention to provide an anti-entrapment system having a sensor that detects a translating device pinching an object as soon as the translating device has applied a relatively small amount of pinching to the object and/or detects the presence of the object within an opening which may be closed by the translating device in order to prevent any pinching of the object by the translating device.

In carrying out the above object and other objects, the present invention provides an anti-entrapment system for preventing an object from being entrapped by a translating device. The system includes a capacitance sensor positioned adjacent to a translating device. The capacitance sensor has first and second flexible conductors separated by a separation distance. The first and second flexible conductors have a capacitance dependent on the separation distance. The capacitance sensor further has a compressible dielectric element interposed between the first and second flexible conductors.

The capacitance of the first and second flexible conductors changes in response to the separation distance changing as a result of the dielectric element compressing in response to a first object touching the capacitance sensor. The capacitance of the first and second flexible conductors changes in response to a second conductive object coming into proximity with at least one of the first and second flexible conductors. A controller controls the translating device as a function of the capacitance of the first and second flexible conductors in order to prevent the translating device from entrapping either of the first object or the second conductive object.

The first flexible conductors may be a center core with the second flexible conductor coaxially surrounding the dielectric element and the first flexible conductor. In this case, the first flexible conductor may be electrically grounded.

An elastomer overcoat which may be semi-rigid may surround the second flexible conductor. The dielectric element may be a semi-rigid elastomer, air, a cell foam, and the like. At least one of the first and second flexible conductors may include a braided metal wire.

The translating device may be an automobile window. In this case, the capacitance sensor may be positioned on a window body panel which receives the automobile window when the automobile window is in a fully closed position. The capacitance sensor may be formed integral with an automobile weather strip which receives the automobile window when the automobile window is in a fully closed position.

The translating device is an automobile sliding-door, an automobile sunroof, an automobile deck lid, an automobile hatch, an automobile tonneau cover, and the like. The translating device may also be a pair of doors, a pair of elevator doors, a garage door. The translating device may also be a movable press mechanism.

The controller, which may include a microprocessor, may be operable for generating an offset signal to bias the capacitance between the first and second flexible conductors. The controller may also be operable for executing filtering software to monitor the capacitance between the first and second flexible conductors. The controller may be further operable for executing an adaptive threshold detection algorithm to monitor the capacitance between the first and second flexible conductors.

Further, in carrying out the above object and other objects, the present invention provides a second anti-entrapment system for preventing an object from being entrapped by a translating device. The second anti-entrapment system includes a capacitance sensor positioned adjacent to a translating device. The capacitance sensor has first, second, and third flexible conductors. The conductor coaxially surrounds the second conductor with a first compressible dielectric element interposed therebetween. The second conductor coaxially surrounds the first conductor with a second compressible dielectric element interposed therebetween. The first and second conductors are separated by a separation distance. The second conductor is electrically grounded.

The first and second conductors have a capacitance dependent on the separation distance. The capacitance of the first and second conductors changes in response to the separation distance changing as a result of the second dielectric element compressing in response to a first object touching the capacitance sensor. The second and third conductors have a capacitance dependent on the proximity of a second conductive object with the third conductor. The capacitance of the second and third conductors changes in response to the second conductive object coming into proximity with the third conductor. A controller controls the translating device as a function of the capacitance of the first and second conductors and the capacitance of the second and third conductors in order to prevent the translating device from entrapping either of the first object or the second conductive object.

Also, in carrying out the above object and other objects, the present invention provides a third anti-entrapment system for preventing an object from being trapped by a translating device. The third anti-entrapment system includes a capacitance sensor positioned adjacent to a translating device. The capacitance sensor has a capacitance pinch sensor and a capacitance proximity sensor positioned side-by-side and both being encased by a single elastomer outer jacket.

The capacitance pinch sensor includes first and second flexible conductors and a first compressible dielectric element interposed therebetween. The second conductor coaxially surrounds the first dielectric element and the first conductor such that the first and second conductors are separated by a separation distance. The second conductor is electrically grounded. The first and second conductors have a first capacitance dependent on the separation distance. The first capacitance changes in response to the separation distance changing as a result of the dielectric element compressing in response to a first object touching the capacitance pinch sensor.

The capacitance proximity sensor includes third and fourth conductors and a second compressible dielectric element interposed therebetween. The fourth conductor coaxially surrounds the second dielectric element and the third conductor. The third conductor is electrically grounded. The third and fourth conductors have a second capacitance which changes in response to a second conductive object coming into proximity with the fourth conductor.

A controller controls the translating device as a function of the first and second capacitances in order to prevent the translating device from entrapping either of the first object or the second conductive object.

Still further, in carrying out the above object and other objects, the present invention provides a fourth anti-entrapment system for preventing an object from being entrapped by a translating device. The fourth anti-entrapment system includes a capacitance sensor positioned adjacent to a translating device. The capacitance sensor includes an elastomer outer jacket having an interior. The capacitance sensor further includes a spanner held at each end by the outer jacket within the interior of the outer jacket. The spanner holds a first flexible conductor within the interior of the outer jacket and the outer jacket encases a second flexible conductor such that the first and second conductors are separated from one another by a separation distance. The first and second conductors have a capacitance dependent on the separation distance. The capacitance sensor further has a compressible dielectric element within the interior of the outer jacket. The capacitance of the first and second conductors changes in response to the separation distance changing as a result of the dielectric element compressing in response to a first object touching the outer jacket. The capacitance of the first and second conductors changes in response to a second conductive object coming into proximity with at least one of the first and second conductors. A controller controls the translating device as a function of the capacitance of the first and second conductors in order to prevent the translating device from entrapping either of the first object or the second conductive object.

The spanner may include first and second portions. The first spanner portion being a conductive flexible elastomer and the second spanner portion being a non-conductive flexible material. The first spanner portion holds the first conductor within the interior of the outer jacket. The second spanner portion is held at each end to the outer jacket.

Yet further, in carrying out the above object and other objects, the present invention provides a fifth anti-entrapment system for preventing an object from being entrapped by a translating device. The fifth anti-entrapment system includes a capacitance sensor positioned adjacent to a translating device. The capacitance sensor has a flexible conductor separated from a metal frame by a separation distance. The conductor has a capacitance dependent on the separation distance. The capacitance sensor further has a compressible non-conductive elastomer encasing the first conductor and resting on the metal frame. The capacitance of the conductor changes in response to the separation distance changing as a result of the compressible non-conductive elastomer compressing in response to a first object touching the first conductor. The capacitance of the conductor changes in response to a second conductive object coming into proximity with the conductor. A controller controls the translating device as a function of the capacitance of the conductor in order to prevent the translating device from entrapping either of the first object or the second conductive object. The conductor may have an endless configuration.

The above object and other objects, features, and advantages of the present invention are readily apparent from the following detailed description of the preferred embodiment(s) when taken in connection with the accompanying drawings.

BRIEF DESCRIPTION OF DRAWINGS

FIG. 1A illustrates a block diagram of an anti-entrapment system in accordance with the present invention;

FIG. 1B illustrates a block diagram of the anti-entrapment system in which the sensor and controller are integrated;

FIG. 2 illustrates a first embodiment of the sensor of the antientrapment system;

FIG. 3 illustrates a cross-sectional view of the sensor taken along the line 3—3 of FIG. 2;

FIG. 4A illustrates the operation of the sensor of the anti-entrapment system for detecting the proximity of an object to the sensor;

FIG. 4B illustrates the operation of the sensor of the anti-entrapment system for detecting an object touching the sensor;

FIG. 14 illustrates the placement of the sensor of the anti-entrapment system for use in a garage door environment;

FIG. 15 illustrates the placement of the sensor of the anti-entrapment system for use with an industrial machine;

FIG. 16 illustrates a second embodiment of the sensor of the anti-entrapment system;

FIG. 17 illustrates a cross-sectional view of the sensor shown in FIG. 16 taken along the line 17—17 of FIG. 16;

FIG. 18 illustrates a third embodiment of the sensor of the anti-entrapment system;

FIG. 19 illustrates a cross-sectional view of the sensor shown in FIG. 18 taken along the line 19—19 of FIG. 18;

FIG. 20 illustrates a fourth embodiment of the sensor of the anti-entrapment system;

FIG. 21 illustrates a cross-sectional view of the sensor shown in FIG. 20 taken along the line 21—21 of FIG. 20;

FIG. 22 illustrates a fifth embodiment of the sensor of the anti-entrapment system;

FIG. 23 illustrates a cross-sectional view of the sensor shown in FIG. 22 taken along the line 23—23 of FIG. 22;

FIG. 24 illustrates a sixth embodiment of the sensor of the anti-entrapment system;

FIG. 25 illustrates a cross-sectional view of the sensor shown in FIG. 24 taken along the line 25—25 of FIG. 24;

FIG. 26 illustrates a seventh embodiment of the sensor of the anti-entrapment system;

FIG. 27 illustrates a cross-sectional view of the sensor shown in FIG. 26 taken along the line 27—27 of FIG. 26;

FIG. 28 illustrates an eighth embodiment of the sensor of the anti-entrapment system;

FIG. 29 illustrates a cross-sectional view of the sensor shown in FIG. 28 taken along the line 29—29 of FIG. 28;

FIG. 30 illustrates a ninth embodiment of the sensor of the anti-entrapment system;

FIG. 31 illustrates a cross-sectional view of the sensor shown in FIG. 30 taken along the line 31—31 of FIG. 30;

FIG. 32 illustrates a cross-sectional view of the placement of the sensor of the anti-entrapment system for use with a tonneau cover environment;

FIG. 33 illustrates a top view of the placement of the sensor of the anti-entrapment system for use with the tonneau cover environment;

FIG. 34 illustrates a tenth embodiment of the sensor of the anti-entrapment system;

FIG. 35 illustrates a cross-sectional view of the sensor shown in FIG. 34 taken along the line 35—35 of FIG. 34;

DETAILED DESCRIPTION OF THE PREFERRED EMBODIMENT(S)

Figure 5:
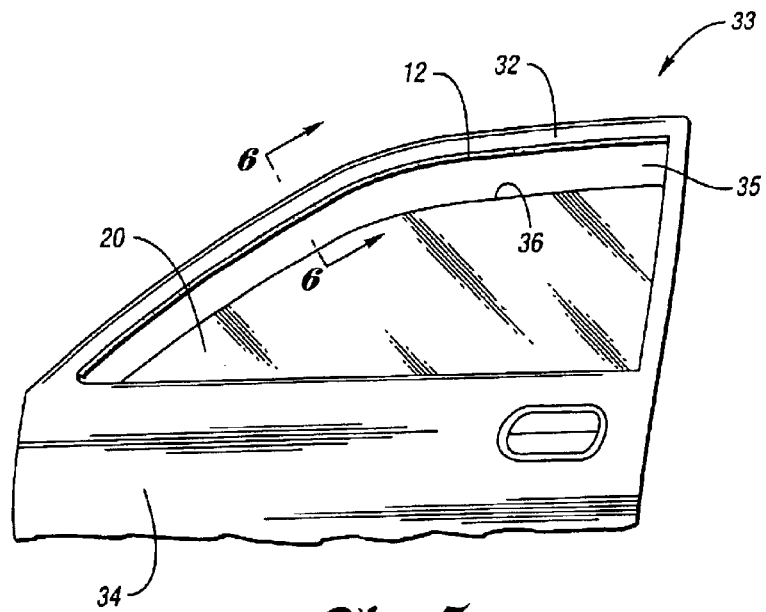
FIG. 5 illustrates the placement of the sensor of the anti-entrapment system for use in an automobile door-window environment.

Referring now to FIG. 1A, an anti-entrapment system 10 in accordance with the present invention is shown. Anti-entrapment system 10 includes a sensor 12 and a controller 14. Sensor 12 is a capacitance sensor that is operable to detect touching by an object 16 to the sensor and/or the presence of the object near the sensor. In response to an object 16 touching sensor 12, the capacitance of the sensor changes. Likewise, in response to an object 16 that is electrically conductive, including the human body, coming within the proximity of sensor 12, the capacitance of the sensor changes even without the object actually touching, or applying any force, to the sensor. This provides for zero force detection of a human body part before contact is made to the body part. As such, sensor 12 is a contact and a non-contact sensor.

Controller 14 controls a motor 18 associated with a translating device 20 such as a window, sliding door, sunroof, etc. in order to move the translating device between opened and closed positions. Controller 14 controls motor 18 to move translating device 20, i.e., window, in an opening direction when an opening provided by the window is desired. Similarly, controller 14 controls motor 18 to move window 20 in a closing direction in order to close off the window opening.

Generally, an operator actuates a switch to have controller 14 control the opening and closing of window 20. Such a switch may be configured to provide express-up (i.e., express close) and express-down (i.e., express open) functionality such that a single switch actuation (as opposed to a continuous actuation) causes controller 14 to control window 20 until the window has fully moved into its opened or closed position.

Sensor 12 is placed adjacent to a window opening provided by window 20. Sensor 12 monitors the window opening to determine whether an object 16 such as a person's hand or finger is near or extends through the window opening. As can be appreciated, a problem with object 16 extending through the window opening is that when window 20 moves in the closing direction and closes off the window opening, the window will pinch the object unless the object is removed from the window opening.

Sensor 12 is placed adjacent to the window opening such that object 16 touches the sensor and/or becomes in close proximity to the sensor if the object is caught between the window opening and window 20 and is about to be pinched by the window. Sensor 12 generates a pinch sensor signal 21 in response to object 16 touching the sensor and generates a proximity sensor signal 23 in response to the object being in close proximity to the sensor. Sensor 12 provides pinch and proximity sensor signals 21 and 23 to controller 14. In response to receiving either of pinch and proximity sensor signals 21 and 23, controller 14 controls window 20 via motor 18 accordingly.

For instance, if the operator has actuated the switch to have controller 14 close window 20 and the window is now closing (for example, when the window is in express-up operation), the controller controls the window to stop closing and open in response to a subsequent detection by sensor 12 of object 16 within the window opening. Reversing the direction of window 20 and opening the window causes the window opening to increase in order to prevent any pinching of the object and to give time for the object to be removed from the window opening. Similarly, if sensor 12 detects the presence of object 16 within window opening, then controller 14 prevents window 20 from subsequently moving in the closing direction until the object has been removed from the window opening.

Referring now to FIG. 1B, sensor 12 and controller 14 may be integrated with one another to form a sensor/controller 13. Sensor/controller 13 effectively provides the same function as non-integrated sensor 12 and controller 14. As such, in this document, the description regarding sensor 12 and controller 14 also refers to the sensor and controller functionality provided by sensor/controller 13.

It is to be appreciated that controller 14 can have switch inputs, communications capability with other sensors and controllers, and various outputs for controlling and monitoring various aspect of window 20. For instance, controller 14 can have sensor inputs for motor 18 as designated by line 19 in FIG. 1A or other moving members to determine the position, direction of movement, speed of movement, etc. of window 20. Such sensor inputs could be for receiving signals from Hall Effect sensors and the like such as optic and resistive sensors.

In the case of controller 14 receiving sensor signals responsive to motor 18 or other moving members, the controller would have additional anti-entrapment capabilities by making use of motor current and/or commutator pulses and/or sensor signals from Hall (or other type) sensors. This would have the added benefit of being able to detect obstructions while the moving member and the obstruction are too far away from sensor 12 to be sensed by sensor 12.

Referring now to FIGS. 2 and 3, a first embodiment of sensor 12 is shown. Sensor 12 includes a flexible center conductive element or core 22 coaxially surrounded by a non-conductive compressible element or layer 26 that is in turn coaxially surrounded by a flexible outer conductive element or layer 24. Non-conductive compressible layer 26 separates conductive core 22 and conductive layer 24. Conductive core 22 is electrically grounded for sensor 12. An elastomeric overcoat 28 covers conductive layer 24.

Conductive core 22 and conductive layer 24 are made from conductive materials such as aluminum, copper, and the like. Conductive core 22 and conductive layer 24 may also be made from materials such as nylon, polyester, and the like that have been plated or metalized with a conductive material such as aluminum, copper, nicked, and the like. Conductive core 22 and conductive layer 24 each may be a braided mesh or a metalized woven fabric which gives the conductive core and the conductive layer their flexibility. Conductive core 22 and conductive layer 24 may also be a plated woven fabric that has as a metalization coating of copper, for proper conductivity, with a nickel coating over the copper, for corrosion resistance. Non-conductive compressible layer 26 may be an EPDM closed cell foam having a high dielectric constant and a low compressible force. The dielectric constant and/or compressibility of non-conductive layer 26 may be changed by using different types of materials. For instance, non-conductive layer 26 may simply be air. Elastomeric overcoat 28 may be made from elastomeric rubbers, like vinyl, thermo-plastic elastomers such as Santoprene, Neoprene, Buna N, and the like. Elastomeric overcoat 28 could also be felt fabric and the like. Elastomeric overcoat 28 may be semi-rigid, flexible, and/or compressible and may incorporate sealing elements, adhesives, and other attachments.

Referring now to FIG. 4A with continual reference to FIG. 1, the operation of sensor 12 for determining the presence of an object within the proximity of the sensor will now be described in more detail. Sensor 12 is mounted to a fixed assembly such as an automobile window body panel 32. Sensor 12 can also be embodied in the automobile window weather-strip and the like. In FIG. 4A, an electrically conductive object 30 such as a human body part is placed in the window opening between window 20 and sensor 12. As shown, the window opening is sufficiently large enough such that object 30 can move freely in the window opening without being pinched by window 20. If the window opening becomes smaller as the result of window 20 closing such that object 30 becomes proximal to sensor 12 and into the capacitive field surrounding conductive layer 24, then the capacitance of the sensor changes.

Sensor 12 then generates proximity sensor signal 23 indicative of this change in capacitance to controller 14. Controller 14 processes proximity sensor signal 23 to determine that the capacitance of sensor 12 has changed as a result of object 30 being proximal to sensor 12 and is about to be pinched by window 20. Controller 14 then controls motor 18 to open window 20 and reverse its movement away from window body panel 32 thereby increasing the window opening and allowing object 30 to be removed from the window opening without any pinching of the object by the window.

Referring now to FIG. 4B with continual reference to FIG. 1, the operation of sensor 12 for detecting an object touching the sensor will now be described in more detail. In FIG. 4B, window 20 starts to close in the direction of the arrow towards window body panel 32 and the window opening becomes smaller such that a non-electrically conductive object 31 is between sensor 12 and window 20 and touches the sensor. In response to object 31 touching sensor 12, the sensor compresses such that the distance between conductive core 20 and conductive layer 24 becomes smaller. As a result of this distance becoming smaller, the capacitance of sensor 12 changes.

Sensor 12 then generates pinch sensor signal 21 indicative of this change in capacitance to controller 14. Controller 14 processes pinch sensor signal 21 to determine that the capacitance of sensor 12 has changed as a result of object 31 touching the sensor and is about to be pinched by window 20. Controller 14 then controls motor 18 to open window 20 and reverse its movement away from window body panel 32 thereby increasing the window opening and allowing object 31 to be removed from the window opening without any pinching of the object by the window. It is to be appreciated that an electrically conductive object such as object 30 may also touch sensor 12 and, in this case, the sensor likewise compresses and generates a pinch sensor signal indicative of the resulting change in capacitance.

Controller 14 may be an electronic controller such as a microprocessor based controller that includes a digital to analog (DAC) converter. The DAC converter allows for the subtraction (or an addition) of an offset voltage to allow for greater amplification of pinch and proximity sensor signals 21 and 23. Alternative embodiments could include analog waveform generation, such as a triangle wave, to accomplish the determination of the magnitude of the offset voltage for subsequent subtraction (or addition) thereof. The microprocessor of controller 14 may execute software for filtering and may use algorithms for adaptive threshold detection enabling determination of object proximity to sensor 12 or compression of the sensor as a result of the object touching the sensor. In further alternative embodiments, the microprocessor of controller 14 may be substituted with discrete electronic, hybrid electronics, or a custom application specific integrated circuit that may include microprocessor core analog and digital circuitry.

Controller 14 may also incorporate system functions such as functions of a vehicle door system. Such door system functions include functions associated with power mirrors, such as movement, electrochromatic control, turn signal indication, and heating control; power door locks; keyless entry systems; personalization settings, such as driver 1 and driver 2; and the like. In this instance, controller 14 uses a microcontroller with serial communications, via wires, optic fibers, or wireless such as RF wireless, to communicate with other control modules located within a vehicle. The use of such a controller eliminates the redundancy of multiple modules in a door system. In this instance, controller 14 can be integrated with the window lift motor, or be a separate module that is wired to items controlled by the module.

Controller 14 may also incorporate other system functions based on mounting locations and other than a vehicle door. Functions associated with mounting locations such as the dashboard, center console, or seat may be integrated into the module. Functions such as steering wheel and steering column adjustments, seat position settings, seat heating and cooling, global positioning and internet communications, and pedal adjustment.

Referring now to FIG. 5, the placement of sensor 12 of anti-entrapment system 10 for use in an automobile door-window environment 33 is shown. Automobile door-window environment 32 includes a door 34 and a window body panel 32. Window 20 automatically moves down and up to open and close with respect to window body panel 32. In an opened position, window 20 forms a window opening 35 between a top edge 36 of the window and window body panel 32. Sensor 12 is placed along window body panel 32. As described above, sensor 12 is operable to detect the presence of an object extending through window opening 35 that is adjacent to the sensor and/or is touching the sensor. Such capability enables sensor 12 to function in conjunction with controller 14 to prevent window 20 from pinching the object as the window closes off window opening 35.

Figure 6A:
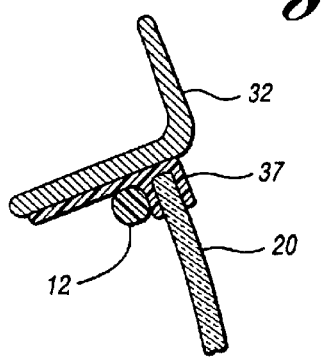
FIG. 6A illustrates a cross-sectional view of a first placement of the sensor in the automobile door-window environment taken along the line 6—6 of FIG. 6.

FIG. 6A illustrates a cross-sectional view of a first placement of sensor 12 relative to window 20 and window body panel 32. Sensor 12 is placed within the interior of the automobile adjacent to window body panel 32 and a window weather strip 37. Window weather strip 37 is attached to window body panel 32 and seals off window 20 when the window moves to its fully closed position as shown in FIG. 6A.

Figure 6B:
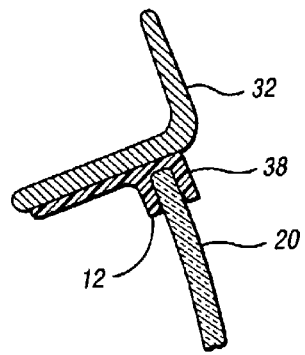
FIG. 6B illustrates a cross-sectional view of a second placement of the sensor in the automobile door-window environment taken along the line 6—6 of FIG. 6.
Figure 7:
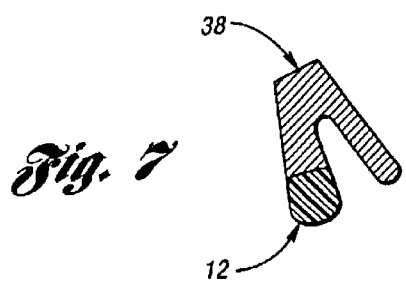
FIG. 7 illustrates in greater detail the sensor placement shown in FIG. 6B.

FIG. 6B illustrates a cross-sectional view of a second placement of sensor 12 relative to window 20 and window body panel 32. Sensor 12 is formed integral with a window weather strip 38 which is attached to window body panel 32. FIG. 7 illustrates in greater detail the integration of sensor 12 within window weather strip 38.

Figure 8:
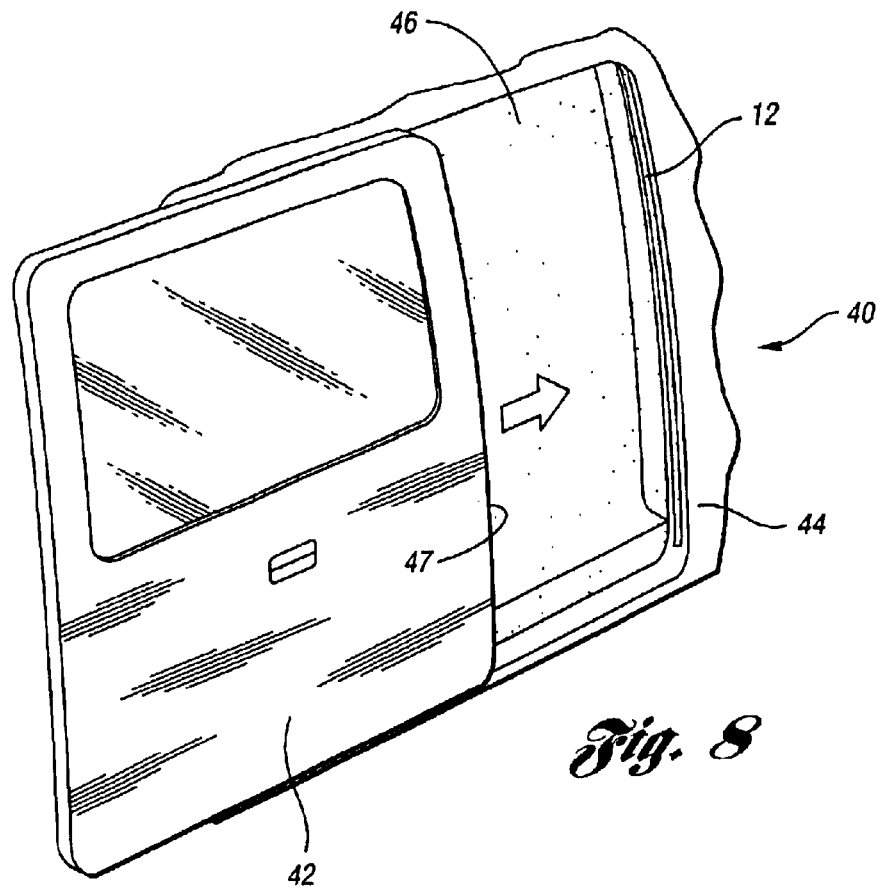
FIG. 8 illustrates the placement of the sensor of the anti-entrapment system for use in an automobile sliding-door environment.

Referring now to FIG. 8, the placement of sensor 12 of anti-entrapment system 10 for use in an automobile sliding-door environment 40 is shown. Automobile sliding-door environment 40 includes an electrically operated sliding door 42 and an automobile door body panel 44. Sliding door 42 moves horizontally to open and close with respect to door body panel 44. In an opened position, sliding door 42 forms a door opening 46 between a leading edge 47 of the sliding door and door body panel 44. Sensor 12 is placed along door body panel 44 in a manner analogous to the placement of the sensor as shown in either FIG. 6A or FIG. 6B. Sensor 12 may also be mounted on sliding door 42 instead of door body panel 44. Sensor 12 detects the presence of an object extending through sliding door opening 46 that is adjacent to the sensor and/or is touching the sensor. In response to sensor 12 detecting an object extending through door opening 46, controller 14 prevents sliding door 42 from pinching the object as the sliding door moves in the direction of the illustrated arrow and closes off door opening 46.

Figure 9:
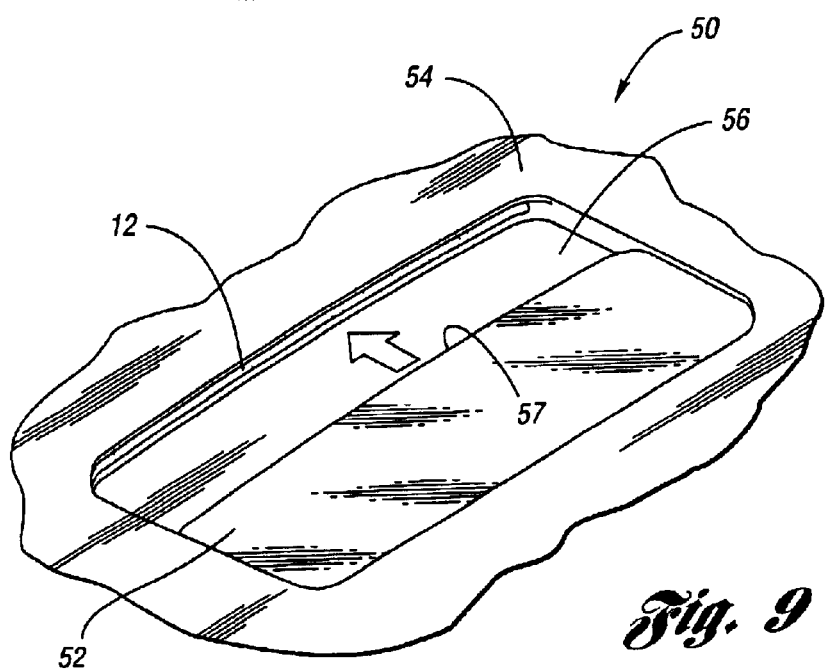
FIG. 9 illustrates the placement of the sensor of the anti-entrapment system for use in an automobile sunroof environment.

Referring now to FIG. 9, the placement of sensor 12 of anti-entrapment system 10 for use in an automobile sunroof environment 50 is shown. Automobile sunroof environment 50 includes an electrically operated sliding sunroof 52 and an automobile roof 54. Sunroof 52 moves horizontally with respect to roof 54 to form and close an opening 56 in the roof. In an opened position, sunroof 52 forms roof opening 56 between a leading edge 57 of the sunroof and roof 54. Sensor 12 is placed along roof 54 in a manner analogous to the placement of the sensor as shown in either FIG. 6A or FIG. 6B. As described above, sensor 12 is operable to detect the presence of an object extending through roof opening 56 that is adjacent to the sensor and/or is touching the sensor. Such capability enables sensor 12 to function in conjunction with controller 14 to prevent sunroof 52 from pinching the object as the sunroof closes off roof opening 56.

Figure 10:
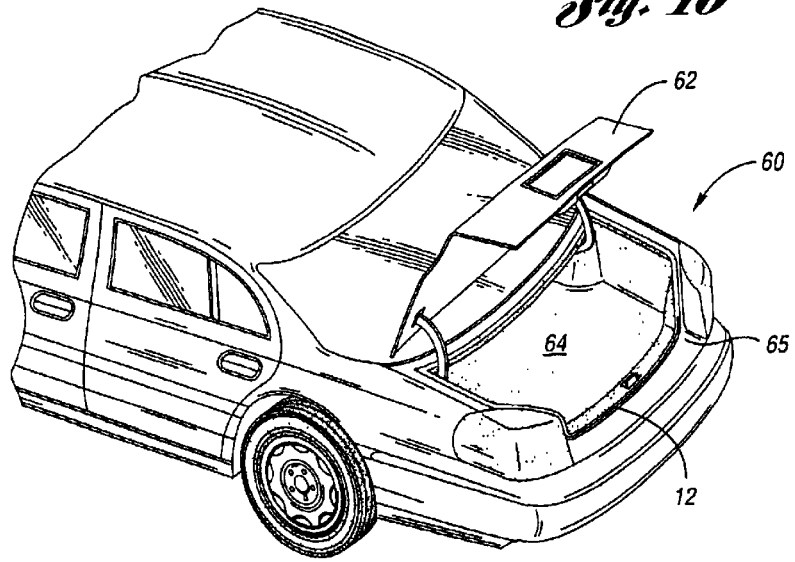
FIG. 10 illustrates the placement of the sensor of the anti-entrapment system for use in an automobile deck lid environment.

Referring now to FIG. 10, the placement of sensor 12 of anti-entrapment system 10 for use in an automobile deck lid environment 60 is shown. Automobile deck lid environment 60 includes an electrically operated deck lid 62. Deck lid 62 opens and closes with respect to an automobile trunk 64. Sensor 12 is placed along an edge 65 of trunk 64 in a manner analogous to the placement of the sensor as shown in either FIG. 6A or FIG. 6B. As described above, sensor 12 detects the presence of an object extending from the exterior of trunk 64 into the interior of the trunk as a result of such object being adjacent to the sensor and/or touching the sensor. Sensor 12 provides appropriate sensor signals to controller 14 in order to prevent deck lid 62 from pinching the object as the deck lid closes off trunk 64.

Figures 11A, 11B:
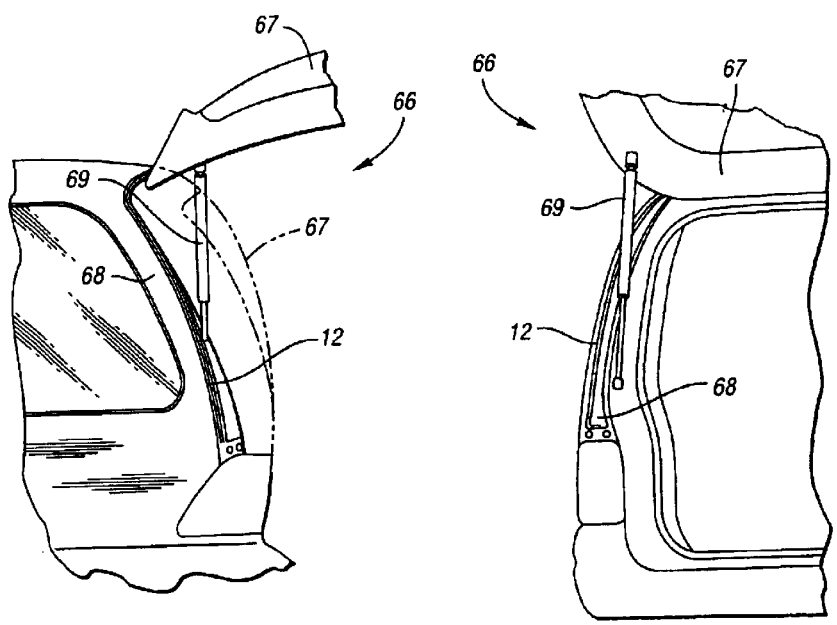
FIGS. 11A and 11B illustrate the placement of the sensor of the anti-entrapment system for use in a hatchback environment.
Figure 12:
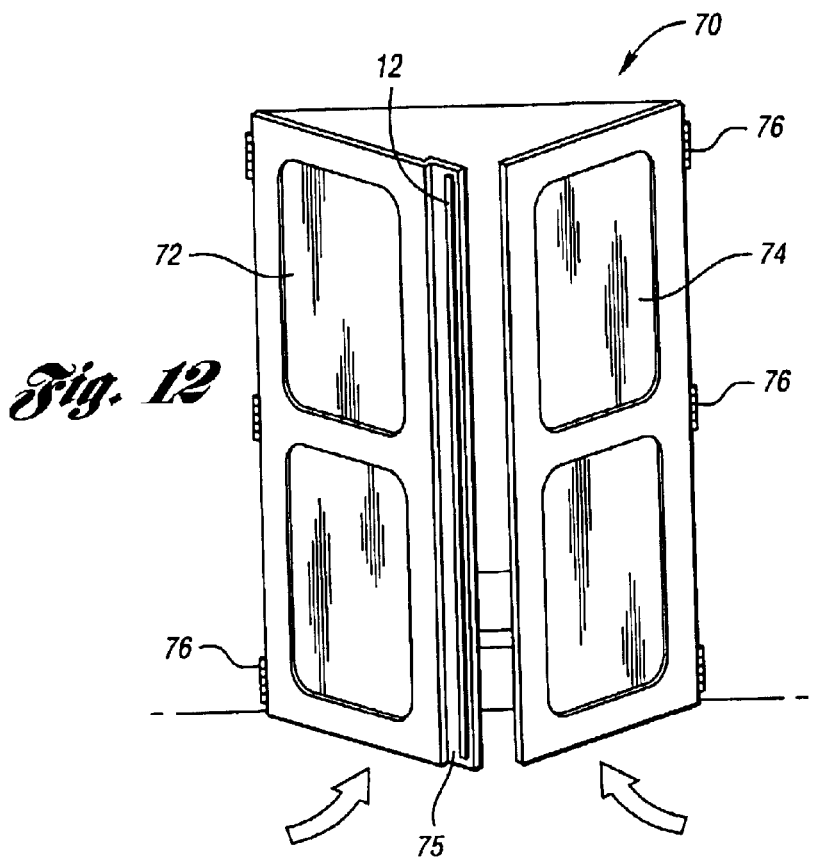
FIG. 12 illustrates the placement of the sensor of the anti-entrapment system for use in an automated bus door environment.

In addition to the automobile applications described above, anti-entrapment system 10 may also be used in other automobile applications including those involving tonneau covers and hatchback doors. For instance, as shown in FIGS. 11A and 11B, the placement of sensor 12 for use in an automobile hatchback environment 66 is shown. Automobile hatchback environment 66 includes a hatch 67 and an automobile body panel 68. A cylinder 69 connects hatch 67 and automobile body panel 68. Cylinder 69 includes a piston rod which extends to move hatch 67 to an opened position with respect to body panel 68 and contracts to move the hatch to a closed position with respect to the body panel (the hatch in the closed position is shown as a dotted line in FIG. 11A). Sensor 12 is placed along body panel 68. Sensor 12 detects the presence of an object extending in the opening between hatch 67 and body panel 68 that is adjacent to the sensor and/or is touching the sensor. Controller 14 is then able to control cylinder 69 to prevent hatch 67 from pinching the object as the hatch is being closed.

Referring now to 12, the placement of sensor 12 for use in an automated bus door environment 70 is shown. Automated bus door environment 70 includes a pair of electrically operated doors 72 and 74. Hinges 76 power doors 72 and 74 to automatically open and close. When closing, door 72 closes prior to door 74 such that door 74 overlaps door 72 when both doors are closed. Sensor 12 is placed along an edge 75 of door 72 and may be incorporated into a door weather strip. Sensor 12 detects the presence of an object extending into the door opening as a result of such object being adjacent to the sensor and/or touching the sensor. Sensor 12 functions in conjunction with controller 14 to prevent door 74 from pinching the object as door 74 closes following the closing of door 72.

Figure 13:
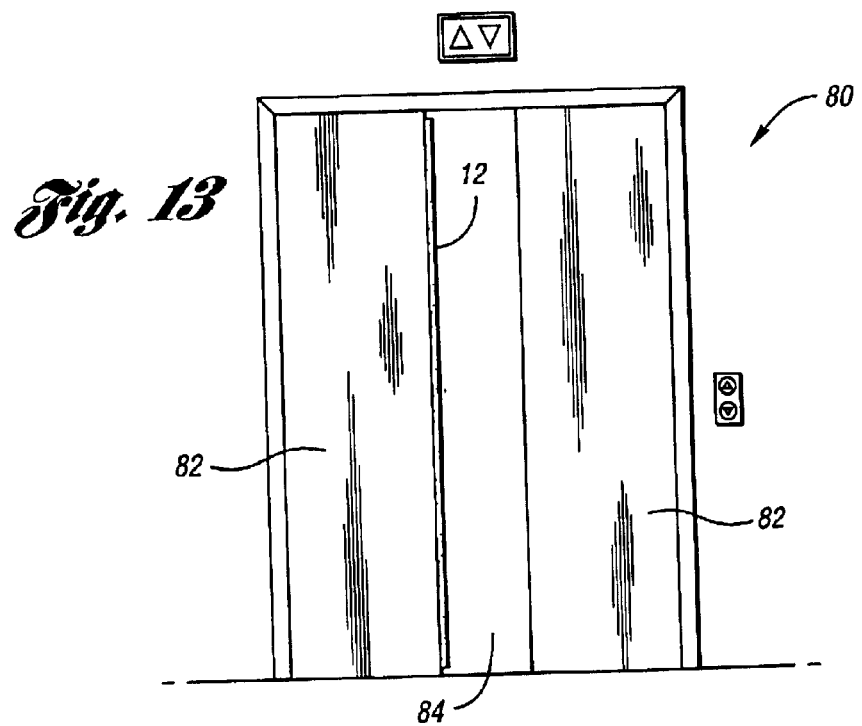
FIG. 13 illustrates the placement of the sensor of the anti-entrapment system for use in an elevator door environment.

In addition to automobile applications, anti-entrapment system 10 may also be used in industrial applications. For instance, FIGS. 13 and 14 illustrate the placement of sensor 12 of anti-entrapment system 10 for use in an elevator door environment 80 and a garage door environment 85, respectively. Elevator door environment 80 is a specific application of a general sliding door environment. In elevator door environment 80, sensor 12 is placed on a leading edge of either elevator door 82. Elevator doors 82 are shown partially opened with an elevator door opening 84 therebetween. Sensor 12 detects the presence of an object extending between elevator doors 82 as a result of such object being adjacent to the sensor and/or touching the sensor. Sensor 12 generates an appropriate sensor signal for controller 14 in order to prevent elevator doors 82 from pinching the object as the doors slide close.

In garage door environment 85, sensor 12 is placed along a bottom edge 86 of a garage door 87. Garage door 87 is shown partially opened with a garage door opening 88 between bottom edge 86 of the garage door and the driveway 89 leading into the garage. Sensor 12 detects the presence of an object extending within garage door opening 88 as a result of such object being adjacent to the sensor and/or touching the sensor. Sensor 12 generates an appropriate sensor signal for controller 14 in order to prevent garage door 87 from pinching the object as the garage door closes.

FIG. 15 illustrates the placement of sensor 12 of anti-entrapment system 10 for use with an industrial machine 90. Industrial machine 90 includes a press machine ram mechanism 91 having an upper press tooling die 92. A lower press tooling die 93 is fixed on a press machine platen 94. Ram mechanism 91 is movable to force upper press tooling die 92 against lower press tooling die 93. During operation, a press operator faces industrial machine 90 in the direction of arrow 95. Sensor 12 is placed within a cavity 96 formed on a front edge 97 of lower press tooling die 93. As such, sensor 12 is positioned to face the press operator. Within cavity 96, sensor does not come into contact with upper press tooling die 92 as this tooling die closes on lower press tooling die 93. During operation of industrial machine 90, sensor 12 detects the presence of an object touching the sensor and/or the presence of a conductive object such as a finger within the proximity of the sensor. Sensor 12 then generates an appropriate sensor signal for controller 14 in order to prevent upper press tooling die 92 from slamming on a foreign object within the vicinity of lower press tooling die 93.

Referring now to FIG. 16, a sensor 100 in accordance with a second sensor embodiment is shown. Sensor 100 is similar to sensor 12 but includes a third flexible conductive element 102 that coaxially surrounds first and second flexible conductive elements 104, 106. Sensor 100 includes a non-conductive compressible coaxial element 108 surrounding first conductor 104 and a non-conductive compressible coaxial element 110 surrounding second conductor 106. An outer elastomeric coating 112 coaxially surrounds third conductor 102. Non-conductive compressible elements 108 and 110 may be made from the same closed cell foam or other compressible material. Like first and second conductors 104, 106, third conductor 102 may also be a braided wire mesh made from a conductive material. Second conductor 106 is electrically grounded.

Referring now to FIG. 17, a cross-sectional view of sensor 100 is shown. A semi-rigid elastomer 110 is used in place of coaxial non-conductive compressible layer 110. Semi-rigid elastomer 110 allows for faster change in capacitance of first and second conductors 104, 106 in the event of an object being in contact with outer coating 112. The distance between third and second conductors 102, 106 and the proximity of an electrically conductive object to third conductor 102 determine the capacitance of the third and second conductors. The distance between first and second conductors 104, 106 determine the capacitance of the first and second conductors. Thus, sensor 100 is a dual-purpose sensor in that it can detect an object in proximity to the sensor and it can detect an object touching the sensor as a function of the corresponding change in capacitance.

Referring now to FIGS. 18 and 19, a sensor 120 in accordance with a third sensor embodiment is shown. Sensor 120 includes two longitudinally parallel flexible conductor core elements 122 and 124 separated by a distance. Two non-conductive compressible coaxial elements 126 and 128 (or semi-rigid elastomers) individually surround respective conductor core elements 122 and 124. Two flexible conductor elements 130 and 132 which are separated by a distance coaxially surround respective non-conductive compressible elements 126 and 128. A semi-rigid elastomeric outer coating 134 encases conductive elements 130 and 132.

Sensor 120 is essentially two sensors 136 and 138. Sensor 136 includes elements 122, 126, 130, and 134. Sensor 138 includes elements 124, 128, 132, and 134. Sensor 136 is configured as a contact sensor (i.e., pinch sensor) such that an object must be in contact with the sensor to cause the distance between conductor elements 122 and 130 to be reduced thereby causing a change in capacitance between conductor elements 122 and 130 that can be used by controller 14. As such, outer conductor element 130 is electrically grounded.

Sensor 138 is configured as a non-contact sensor (i.e., proximity sensor) such that an electrically conductive object that is proximal to outer conductor element 132 causes a change in capacitance between conductor elements 124 and 132 that can be used by controller 14. As such, inner conductor element 124 is electrically grounded. Thus, sensor 120 detects objects in contact with sensor 120 as well as detects electrically conductive objects in proximity to sensor 120.

Referring now to FIGS. 20 and 21, a sensor 140 in accordance with a fourth sensor embodiment is shown. Sensor 140 includes two longitudinally parallel flexible conductor elements 142 and 144 separated by a distance. Two compressible coaxial elements 146 and 148 (or semi-rigid elastomers) individually surround respective conductor core elements 122 and 124. Two metal braided flexible conductor elements 150 and 152 which are separated by a distance coaxially surround respective non-conductive compressible elements 146 and 148. A semirigid elastomeric outer coating 154 encases conductor elements 150 and 152.

Sensor 140 is essentially two sensors 156 and 158. Sensor 156 includes elements 142, 146, 150, and 154. Sensor 158 includes elements 144, 148, 152, and 154. As shown in FIG. 21, outer coating 154 is configured to provide for an entry port 157 for receiving a top edge of a translating device 20 such as a window when the window moves in a closing direction to the closed position. In the closed position, sensors 156 and 158 are located on respective sides of window 20. As such, sensor 140 provides detection of objects that are proximal and/or in contact from multiple directions.

Referring now to FIGS. 22 and 23, a sensor 160 in accordance with a fifth sensor embodiment is shown. Sensor 160 includes an inner flexible conductor 162. A hollow non-conductive flexible spanner 164 holds inner flexible conductor 162 to form lower and upper spanner spaces 166 and 168. Spanner spaces 166 and 168 are filled with air or other dielectric medium. A metal braided outer conductor element 170 coaxially surrounds spanner 164. A semi-rigid elastomer outer jacket 172 encases conductor element 170. Sensor 160 registers a change in capacitance whenever the distance between outer conductor element 170 and inner conductor element 162 changes as a result of an object touching outer jacket 172 and/or as a result of an electrically conductive object coming into proximity with the outer conductor.

Referring now to FIGS. 24 and 25, a sensor 180 in accordance with a sixth sensor embodiment is shown. Sensor 180 includes first and second flexible conductive metal wires 182 and 184. A non-conductive flexible spanner 186 holds first conductor 182. A conductive elastomeric outer jacket 188 having a hollow interior holds and encases second conductor 184 and holds each end of spanner 186. Spanner 186 divides the interior of outer jacket 188 into two spaces 190 and 192. Spaces 190 and 192 are filled with air or other dielectric medium. Sensor 180 registers a change in capacitance whenever the distance between first and second wires 182 and 184 changes as a result of an object touching outer jacket 188 and/or as a result of an electrically conductive object coming into proximity with either of wires 182 or 184.

Turning to FIGS. 34 and 35, a sensor 300 in accordance with a tenth sensor embodiment is shown. Sensor 300 includes first and second flexible conductive metal wires 302 and 304. A conductive flexible elastomer 303 holds first conductor 302. A non-conductive flexible spanner 306 holds and encases conductive elastomer 303. A conductive elastomeric outer jacket 308 having a hollow interior holds and encases second conductor 304 and holds each end of spanner 306. Spanner 306 divides the interior of outer jacket 308 into two spaces 310 and 312. Spaces 310 and 312 are filled with air or other dielectric medium. Sensor 300 registers a change in capacitance whenever the distance between first and second conductors 302 and 304 changes as a result of an object touching outer jacket 308 and/or as a result of an electrically conductive object coming into proximity with either of conductors 302 or 304.

Referring now to FIGS. 26 and 27, a sensor 200 in accordance with a seventh sensor embodiment is shown. Sensor 200 includes a flexible conductor element 202 encased by a compressible non-conductive elastomer 204. Elastomer 204 rests on a metal frame 206 such as a vehicle frame. Metal frame 206 essentially acts as a second conductor element. As such, sensor 200 registers a change in capacitance whenever the distance between conductor element 202 and metal frame 206 changes as a result of an object touching elastomer 204 and/or as a result of an electrically conductive object coming into proximity with conductor element 202.

Referring now to FIGS. 28 and 29, a sensor 220 in accordance with an eighth sensor embodiment is shown. Sensor 220 includes a continuous non-ending flexible metal braid conductor element 222. Conductor element 222 defines an interior 224 which is filled with air or other dielectric medium. A compressible non-conductive elastomer 226 encases conductor element 222 and its interior 224. Elastomer 226 rests on a metal frame 228 which acts as a second conductor element. Sensor 220 registers a change in capacitance whenever the distance between at least a portion of conductor element 222 and metal frame 228 changes as a result of an object touching elastomer 226 and/or as a result of an electrically conductive object coming into proximity with conductor element 222.

Referring now to FIGS. 30 and 31, a sensor 240 in accordance with a ninth sensor embodiment is shown. Sensor 240 includes inner and outer flexible metal braided conductor elements 242 and 244. Inner conductor element 242 surrounds a first non-conductive compressible foam element 246. Outer conductor element 244 surrounds a second non-conductive compressible foam element 248. A semi-rigid elastomeric outer jacket 250 surrounds second conductor element 244. As best shown in FIG. 31, inner and outer conductor elements 242 and 244 are continuous non-ending elements. Inner conductor element 242 is shaped in a given endless configuration to enable omni-directional proximity sensing capability. As inner conductor element 242 is flexible, its shape may be conformed to provide the desired omni-directional proximity sensing.

Referring now to FIGS. 32 and 33, the placement of sensor 12 of anti-entrapment system 10 for use in a tonneau cover environment 260 is shown. Tonneau cover environment 260 includes an electrically operated tonneau cover 262. Tonneau cover 262 includes an outer tonneau cover 264 and an inner tonneau cover 266. Tonneau cover 262 includes a sensor carrier 268 for holding sensor 12. As shown in FIG. 33, sensor carrier 268 holds sensor 12 along a majority of the periphery of tonneau cover 262 up to the location of a duckbill 272. Tonneau cover 262 opens and closes with respect to a bed wall 270. In a manner as described above, sensor 12 detects the presence of an object adjacent to tonneau cover 262 as a result of such object being adjacent to the sensor and/or touching the sensor. Sensor 12 provides appropriate sensor signals to controller 14 in order to tonneau cover 262 from pinching the object as the tonneau cover closes.

Figure 36:
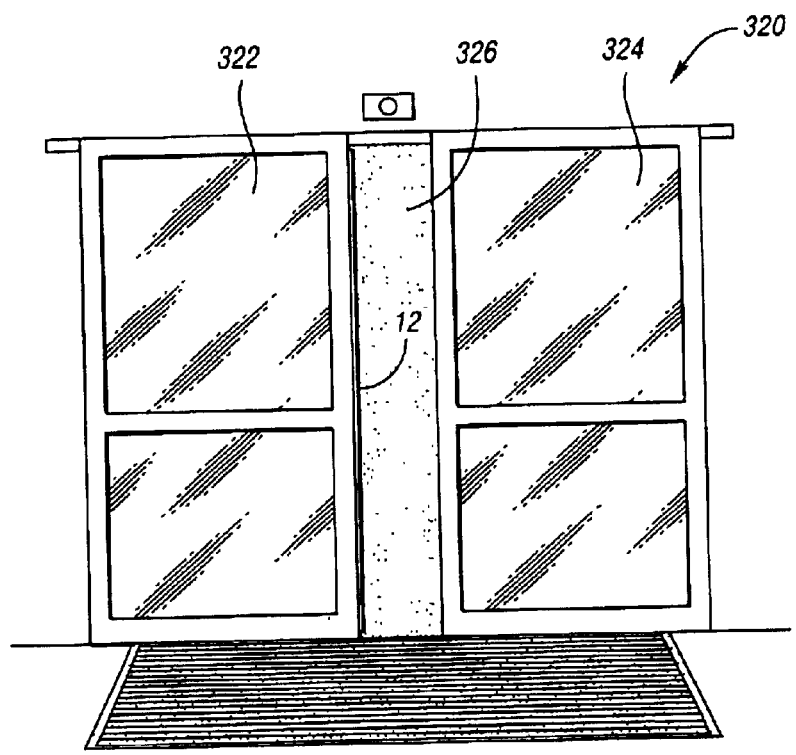
FIG. 36 illustrates the placement of the sensor of the anti-entrapment system for use with a double sliding door environment.
Figure 37:
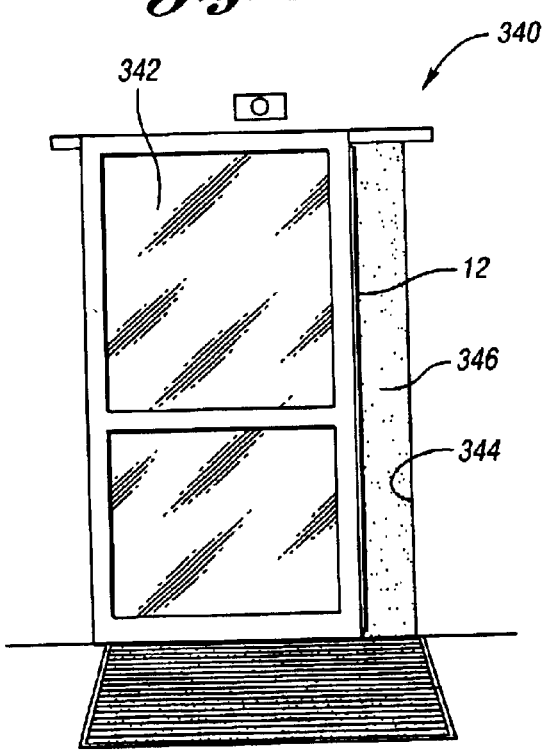
FIG. 37 illustrates the placement of the sensor of the anti-entrapment system for use with a single sliding door environment.

Referring now to FIGS. 36 and 37, the placements of sensor 12 of anti-entrapment system 10 for use in double and single sliding door environments 320 and 340 are respectively shown. Double and single sliding door environments 320 and 340 are typically located in grocery stores and the like. In double sliding door environment 320, sensor 12 is placed on a leading edge of either sliding door 322 or 324. Sliding doors 322 and 324 are shown partially opened with a sliding door opening 326 therebetween. Sensor 12 detects the presence of an object extending between sliding doors 322 and 324 as a result of such object being adjacent to the sensor and/or touching the sensor. Sensor 12 generates an appropriate sensor signal for controller 14 in order to prevent sliding doors 322 and 324 from pinching the object as the doors slide close.

Single sliding door environment 340 includes a sliding door 342 and a door body panel 344. Sliding door 342 moves horizontally to open and close with respect to door body panel 344. In an opened position, sliding door 342 forms a door opening 346 between a leading edge 347 of the sliding door and door body panel 344. Sensor 12 is placed along door body panel 344 in a manner analogous to the placement of the sensor as shown in either FIG. 6A or FIG. 6B. Sensor 12 may also be mounted on sliding door 342 (as shown in FIG. 37) instead of door body panel 344. Sensor 12 detects the presence of an object extending through sliding door opening 346 that is adjacent to the sensor and/or is touching the sensor. In response to sensor 12 detecting an object extending through door opening 346, controller 14 prevents sliding door 342 from pinching the object as the sliding door moves in the direction of the illustrated arrow and closes off door opening 346.

Figure 38:
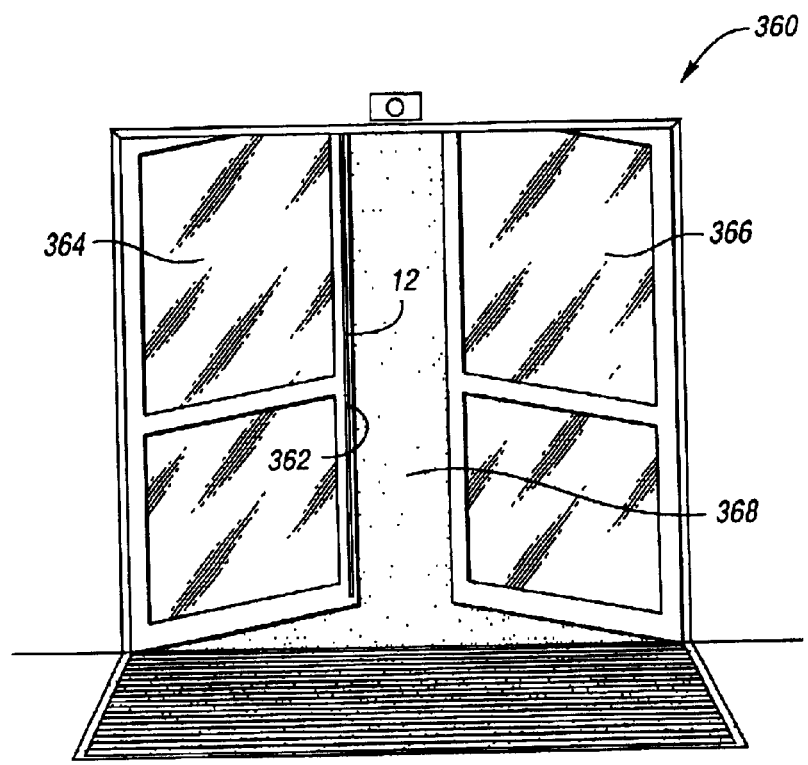
FIG. 38 illustrates the placement of the sensor of the anti-entrapment system for use in a double hinged automatic door environment.
Figure 39:
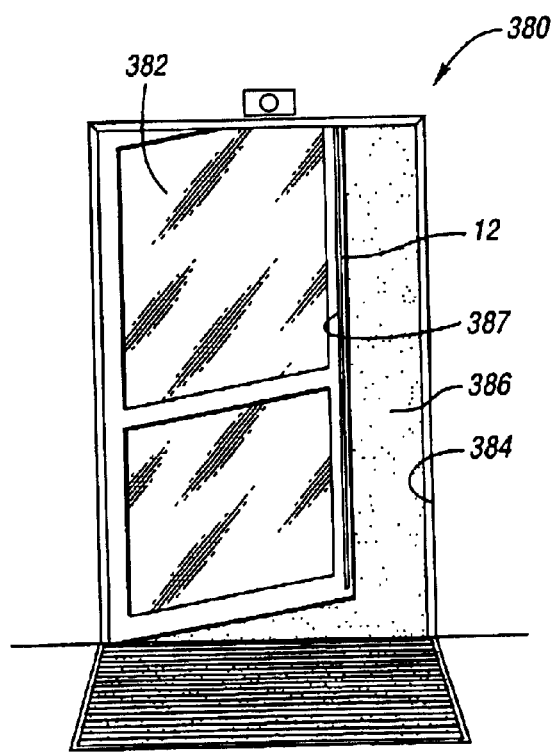
FIG. 39 illustrates the placement of the sensor of the anti-entrapment system for use in a single hinged automatic door environment.

Referring now to FIGS. 38 and 39, the placements of sensor 12 of anti-entrapment system 10 for use in double and single hinged automatic door environments 360 and 380 are respectively shown. Double and single hinged automatic door environments 360 and 380 are typically located in grocery stores and the like. In double hinged automatic door environment 360, sensor 12 is affixed to a sealing surface 362 of either hinged automatic door 364 or 366. Hinged doors 364 and 366 are shown partially opened with a sliding door opening 368 therebetween. Sensor 12 detects the presence of an object extending between hinged doors 364 and 366 as a result of such object being adjacent to the sensor and/or touching the sensor. Sensor 12 generates an appropriate sensor signal for controller 14 in order to prevent hinged automatic doors 364 and 366 from pinching the object as the doors swing to a closed position.

In single hinged automatic door environment 380, sensor 12 is affixed to a sealing surface of a hinged automatic door 382 which closes with respect to a surface of a wall 384. In an opened position, door 382 forms a door opening 386 between a leading edge 387 of the door and wall surface 384. Sensor 12 is placed along wall surface 384 or on leading edge 387 of door 382. Sensor 12 detects the presence of an object extending through door opening 386 that is adjacent to the sensor and/or is touching the sensor in order to enable controller 14 to prevent door 382 from pinching the object as the door swings shut.

While the present invention has been described in conjunction with specific embodiments thereof, it is evident that many alternatives, modifications, and variations will be apparent to those skilled in the art in light of the foregoing description. Accordingly, it is intended to embrace all such alternatives.

What is claimed is:

1. An anti-entrapment system for preventing an object from being entrapped by a translating device, the system comprising:
    a capacitance sensor positioned adjacent to a translating device, the capacitance sensor having first and second flexible conductors separated by a separation distance, the first and second flexible conductors having a capacitance dependent on the separation distance, the capacitance sensor further having a compressible dielectric element interposed between the first and second flexible conductors;
    wherein the capacitance of the first and second flexible conductors changes in response to the separation distance changing as a result of the dielectric element compressing in response to a first object touching the capacitance sensor;
    wherein the capacitance of the first and second flexible conductors changes in response to a second conductive object coming into proximity with at least one of the first and second flexible conductors; and
    a controller for controlling the translating device as a function of the capacitance of the first and second flexible conductors in order to prevent the translating device from entrapping either of the first object or the second conductive object.

2. The system of claim 1 wherein:
the first flexible conductors is a center core and the second flexible conductor coaxially surrounds the dielectric element and the first flexible conductor.

3. The system of claim 2 wherein:
the first flexible conductor is electrically grounded.

4. The system of claim 1 further comprising:
an elastomer overcoat surrounds the second flexible conductor.

5. The system of claim 4 wherein:
the elastomer overcoat is semi-rigid.

6. The system of claim 1 wherein:
the dielectric element is a semi-rigid elastomer.

7. The system of claim 1 wherein:
the dielectric element is air.

8. The system of claim 1 wherein:
the translating device is an automobile window.

9. The system of claim 8 wherein:
the capacitance sensor is positioned on a window body panel which receives the automobile window when the automobile window is in a fully closed position.

10. The system of claim 8 wherein:
the capacitance sensor is formed integral with an automobile weather strip which receives the automobile window when the automobile window is in a fully closed position.

11. The system of claim 8 wherein:
the controller is operable to control an automobile function.

12. The system of claim 11 wherein:
the automobile function includes a power mirror function.

13. The system of claim 11 wherein:
the automobile function includes a power door lock function.

14. The system of claim 11 wherein:
the automobile function includes a seat function.

15. The system of claim 11 wherein:
the automobile function includes a door function.

16. The system of claim 11 wherein:
the automobile function include a dash function.

17. The system of claim 11 wherein:
the automobile function includes a console function.

18. The system of claim 1 wherein:
the translating device is an automobile sliding-door.

19. The system of claim 18 wherein:
the capacitance sensor is positioned on an automobile sliding-door body panel which receives the automobile sliding-door when the automobile sliding-door is in a fully closed position.

20. The system of claim 1 wherein:
the translating device is an automobile sunroof.

21. The system of claim 20 wherein:
the capacitance sensor is positioned on an automobile roof panel which receives the automobile sunroof when the automobile sunroof is in a fully closed position.

22. The system of claim 1 wherein:
the translating device is an automobile deck lid.

23. The system of claim 22 wherein:
the capacitance sensor is positioned on an edge of an automobile trunk which receives the automobile deck lid when the automobile deck lid is in a fully closed position.

24. The system of claim 1 wherein:
the translating device is an automobile hatch.

25. The system of claim 21 wherein:
the capacitance sensor is positioned on an automobile body panel which receives the automobile hatch when the automobile hatch is in a fully closed position.

26. The system of claim 1 wherein:
the translating device is a pair of doors.

27. The system of claim 26 wherein:
the capacitance sensor is positioned on one of the pair of doors which receives the other one of the pair of doors when the pair of doors are in a fully closed position.

28. The system of claim 1 wherein:
the translating device is a sliding door.

29. The system of claim 1 wherein:
the sliding door includes a pair of sliding doors.

30. The system of claim 29 wherein:
the pair of sliding doors is a pair of elevator doors.

31. The system of claim 30 wherein:
the capacitance sensor is positioned on one of the pair of elevator doors.

32. The system of claim 1 wherein:
the translating door is a hinged door.

33. The system of claim 32 wherein:
the capacitance sensor is positioned on the hinged door.

34. The system of claim 32 wherein:
the hinged door includes a pair of hinged doors.

35. The system of claim 1 wherein:
the translating device is a garage door.

36. The system of claim 35 wherein:
the capacitance sensor is positioned on the garage door.

37. The system of claim 1 wherein:
the translating device is a movable press mechanism.

38. The system of claim 37 wherein:
the capacitance sensor is positioned on a press which receives the movable press mechanism.

39. The system of claim 1 wherein:
the translating device is a tonneau cover.

40. The system of claim 1 wherein:
the dielectric element includes a cell foam.

41. The system of claim 1 wherein:
at least one of the first and second flexible conductors includes a braided metal wire.

42. The system of claim 1 wherein:
the controller is operable for generating an offset signal to bias the capacitance between the first and second flexible conductors.

43. The system of claim 1 wherein:
the controller includes a microprocessor.

44. The system of claim 1 wherein:
the controller is operable for executing filtering software to monitor the capacitance between the first and second flexible conductors.

45. The system of claim 1 wherein:
the controller is operable for receiving a sensor signal indicative of a sensed parameter of the translating device, wherein the controller controls the translating device as a function of the sensed parameter.

46. The system of claim 45 wherein:
the sensed parameter is indicative of motor current used by a motor operable for moving the translating device.

47. The system of claim 1 wherein:
the controller is operable for executing an adaptive threshold detection algorithm to monitor the capacitance between the first and second flexible conductors.

48. The system of claim 1 wherein:
the controller performs at least one additional function in addition to controlling the translating device.

49. An anti-entrapment system for preventing an object from being entrapped by a translating device, the system comprising:

a capacitance sensor positioned adjacent to a translating device, the capacitance sensor having first, second, and third flexible conductors, the third conductor coaxially surrounding the second conductor with a first compressible dielectric element interposed therebetween, the second conductor coaxially surrounding the first conductor with a second compressible dielectric element interposed therebetween, the first and second conductors separated by a separation distance, the second conductor being electrically grounded;

wherein the first and second conductors have a capacitance dependent on the separation distance, wherein the capacitance of the first and second conductors changes in response to the separation distance changing as a result of the second dielectric element compressing in response to a first object touching the capacitance sensor;

wherein the second and third conductors have a capacitance dependent on the proximity of a second conductive object with the third conductor, wherein the capacitance of the second and third conductors changes in response to the second conductive object coming into proximity with the third conductor; and a controller for controlling the translating device as a function of the capacitance of the first and second conductors and the capacitance of the second and third conductors in order to prevent the translating device from entrapping either of the first object or the second conductive object.

50. An anti-entrapment system for preventing an object from being trapped by a translating device, the system comprising:

a capacitance sensor positioned adjacent to a translating device, the capacitance sensor having a capacitance pinch sensor and a capacitance proximity sensor positioned side-by-side and both being encased by a single elastomer outer jacket;

wherein the capacitance pinch sensor includes first and second flexible conductors and a first compressible dielectric element interposed therebetween, the second conductor coaxially surrounding the first dielectric element and the first conductor such that the first and second conductors are separated by a separation distance, wherein the second conductor is electrically grounded, wherein the first and second conductors have a first capacitance dependent on the separation distance, wherein the first capacitance changes in response to the separation distance changing as a result of the dielectric element compressing in response to a first object touching the capacitance pinch sensor;

wherein the capacitance proximity sensor includes third and fourth conductors and a second compressible dielectric element interposed therebetween, the fourth conductor coaxially surrounding the second dielectric element and the third conductor, wherein the third conductor is electrically grounded, wherein the third and fourth conductors have a second capacitance which changes in response to a second conductive object coming into proximity with the fourth conductor; and a controller for controlling the translating device as a function of the first and second capacitances in order to prevent the translating device from entrapping either of the first object or the second conductive object.

51. An anti-entrapment system for preventing an object from being entrapped by a translating device, the system comprising:

a capacitance sensor positioned adjacent to a translating device, the capacitance sensor including an elastomer outer jacket having an interior, the capacitance sensor further including a spanner held at each end by the outer jacket within the interior of the outer jacket, the spanner holding a first flexible conductor within the interior of the outer jacket and the outer jacket encasing a second flexible conductor such that the first and second conductors are separated from one another by a separation distance, wherein the first and second conductors have a capacitance dependent on the separation distance, the capacitance sensor further having a compressible dielectric element within the interior of the outer jacket;

wherein the capacitance of the first and second conductors changes in response to the separation distance changing as a result of the dielectric element compressing in response to a first object touching the outer jacket;

wherein the capacitance of the first and second conductors changes in response to a second conductive object coming into proximity with at least one of the first and second conductors; and a controller for controlling the translating device as a function of the capacitance of the first and second conductors in order to prevent the translating device from entrapping either of the first object or the second conductive object.

52. The system of claim 51 wherein:

the spanner is non-conductive.

53. The system of claim 52 wherein:

the spanner includes first and second portions, the first portion being a conductive flexible elastomer and the second portion being a non-conductive flexible material, wherein the first spanner portion holds the first conductor within the interior of the outer jacket, wherein the second spanner portion is held at each end to the outer jacket.

54. An anti-entrapment system for preventing an object from being entrapped by a translating device, the system comprising:

a capacitance sensor positioned adjacent to a translating device, the capacitance sensor having a flexible conductor separated from a metal frame by a separation distance, the conductor having a capacitance dependent on the separation distance, the capacitance sensor further having a compressible non-conductive elastomer encasing the first conductor and resting on the metal frame;

wherein the capacitance of the conductor changes in response to the separation distance changing as a result of the compressible non-conductive elastomer compressing in response to a first object touching the first conductor;

wherein the capacitance of the conductor changes in response to a second conductive object coming into proximity with the conductor; and a controller for controlling the translating device as a function of the capacitance of the conductor in order to prevent the translating device from entrapping either of the first object or the second conductive object.

55. The system of claim 54 wherein:

the conductor has an endless configuration.

* * * * *